United States Patent [19]

Takeuchi

[11] Patent Number: 4,800,304
[45] Date of Patent: Jan. 24, 1989

[54] TIME DELAY CIRCUIT FOR A SEMICONDUCTOR DEVICE

[75] Inventor: Atsushi Takeuchi, Kawasaki, Japan

[73] Assignee: Fujitsu Limited, Kawasaki, Japan

[21] Appl. No.: 193,192

[22] Filed: May 9, 1988

Related U.S. Application Data

[63] Continuation of Ser. No. 6,206, Jan. 23, 1987, abandoned.

[30] Foreign Application Priority Data

Feb. 4, 1986 [JP] Japan .................................. 61-22528

[51] Int. Cl.[4] .......................... H03K 17/26; G11C 7/00
[52] U.S. Cl. ..................................... 307/602; 307/518;
307/234; 328/55; 328/75; 365/194; 365/230
[58] Field of Search ............... 307/601, 602, 518, 234,
307/358; 328/55, 105, 110, 119, 71, 75;
365/194, 230, 233, 236

[56] References Cited

U.S. PATENT DOCUMENTS

| | | |
|---|---|---|
| 3,675,049 | 7/1972 | Haven .................... 307/602 |
| 4,233,525 | 11/1980 | Takahashi et al. ............ 307/234 |
| 4,340,943 | 7/1982 | Asano et al. ............... 365/194 |
| 4,425,633 | 1/1984 | Swain .................... 365/194 |
| 4,435,793 | 3/1984 | Ochii .................... 365/233 |
| 4,556,961 | 12/1985 | Iwahashi et al. ............ 365/194 |
| 4,670,665 | 6/1987 | Harwood et al. ............ 307/234 |
| 4,744,063 | 5/1988 | Ohtani et al. ............. 365/233 |

Primary Examiner—Stanley D. Miller
Assistant Examiner—Tai V. Duong
Attorney, Agent, or Firm—Armstrong, Nikaido, Marmelstein & Kubovcik

[57] ABSTRACT

A plurality of time delay circuit, usually a dummy word line made similarly to a word line having a delay characteristics for charging and discharging, are provided in a memory device in place of a single delay circuit of prior art. A selection circuit selectively drives one of the delay circuits and enables a gate connected to the driven delay circuits in a circulating sequence each time an input pulse is received. A gate circuit detects a moment at which the output voltage of the dummy word line reaches a threshold level and then outputs an enabling signal to the readout sense amplifier. A noise coming-in closely before a normal signal is led to a delay circuit but disabled by the normal signal, thus having no effect on the signal. So, the invention is effective when the input signal is from an address transition detector which, used in an asynchronous memory device, is apt to produce the above-described type of noise. And further, immediately after an enabling signal is outputted, a next address change is acceptable, because the next delay circuit is ready to function without being disturbed by the remaining voltage in the previously used delay circuit. Thus, both the increased speed of memory cycling and the increased scale of integration can be achieved at the same time.

6 Claims, 6 Drawing Sheets

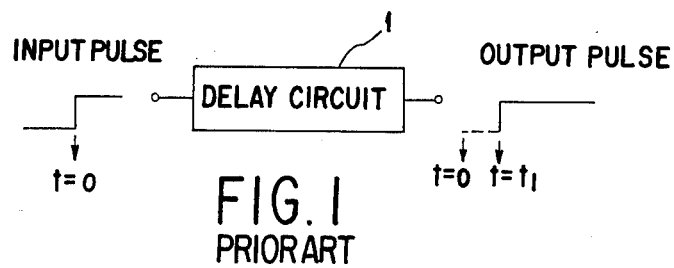
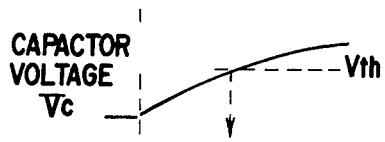
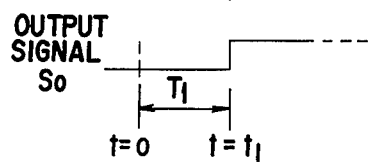
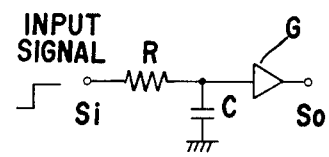
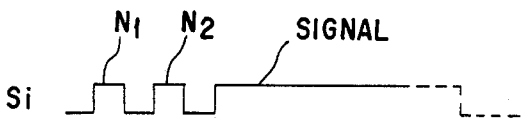
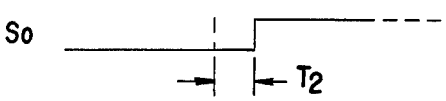

FIG.10B ($\hbar_1$) 
FIG.10C ($i_1$) 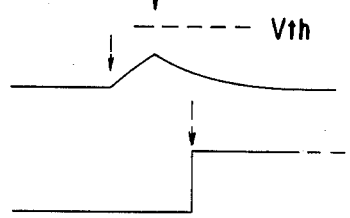 Vth
FIG.10D ($\hbar_2$) 
FIG.10E ($i_2$) 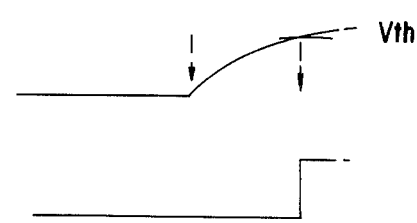 Vth
FIG.10F ($\hbar$) 

TIME DELAY CIRCUIT FOR A SEMICONDUCTOR DEVICE

This application is a continuation of application Ser. No. 006,206 filed Jan. 23, 1987, now abandoned.

BACKGROUND OF THE INVENTION

1. Field of the Invention

This invention relates to a time delay circuit used in a semiconductor device, and particularly to a circuit used to reduce malfunctions caused by noise as used well as to speed up the semiconductor device.

2. Description of the Related Art

A time delay circuit, which has been used in semiconductor devices, produces an output signal $S_o$ at a predetermined delay time $t_1$ measured after an application of an input signal $S_i$ on its input terminal. Among some types of time delay circuits, there is a CR (Capacitance, Resistance) type, in which the input signal $S_i$ is applied via a resistor R to a capacitor C. A voltage $V_c$ slowly produced on the capacitor C is detected by a logical gate circuit G at a predetermined threshold level $V_{th}$ for outputting delayed signals $S_o$, as shown in FIG. 1 and FIGS. 2A-2D using positive pulses. In this type of circuit, if a noise pulse, $N_1$ etc., which is usually short, is input to the time delay circuit 1, the noise pulse charges the time delay circuit 1. Before the charge is completely discharged, if an input signal pulse $S_i$ is input, the voltage $V_c$ on the capacitor C rises to the threshold level $V_{th}$ after a period $T_2$ which is shorter than the normal delay period $T_1$, resulting in malfunction of the time delay circuit, as shown in FIGS. 3A-3C. These kind of noise pulses are very possible for the delay circuit 1 in a semiconductor device. On the other hand, this type of delay circuit can not accept the next input signal until the charge in the delay circuit is completely discharged, for the same reason the voltage $V_c$ of the capacitor rises and reaches the threshold level $V_{th}$ earlier than the normal delay period $T_1$. Thus a malfunction results. In order to solve this problem, there may be provided a circuit which compulsively discharges the residual charge in the capacitor as soon as the delayed signal is output.

However, this measure is not effective for some types of CR delay circuits, such as a distributed CR delay circuit, i.e., a dummy word line which is made similar to a word line of a semiconductor memory device. The word line of a semiconductor IC memory is generally made of relatively high electrically resistive material, such as polycrystalline silicon. Further, the word line has a relatively large stray capacitance along each line. Thus, the word line, i.e., the dummy word line, forms a distributed CR delay circuit. The distributed delay circuit takes some time not only to charge up the capacitances but also to discharge the capacitances, so that the compulsive discharging is not effective for the distributed CR delay circuit. The larger the scale of integration is attempted, the finer, i.e., the more resistive, the word line becomes thus requiring more time to charge and discharge. Also, the higher the cycle speed required in a memory device, the more serious this problem becomes. Therefore, an improved delay circuit which is less susceptive to noise inputs and which is quicker to be ready to accept the next input signal after completion of a delaying operation, has been requested.

SUMMARY OF THE INVENTION

It is a general object of the invention to provide a time delay circuit which can reduce the malfunction caused by an input noise signal as well as can reduce memory cycling time in an increased scale of integration.

According to the present invention, a plurality of delay circuits for delaying an input digital signal is provided. A selection circuit selectively drives one of the delay circuits in a circulating sequence, each time an input signal is received thereto. A gate circuit, whose input terminals are connected to an output terminal of each delay circuit as well as to the output terminals of the selection circuit, outputs a signal when the gate circuit detects a delayed signal from the delay circuit.

A noise input just before a normal input signal is selectively led to one of the delay circuits, but this delay circuit is switched off by the selection circuit before this delay circuit outputs the input noise, thus effect of the noise is avoided. The next input signal or noise coming after completion of one cycle of delaying can be accepted by the next delay circuit. Accordingly, the address cycle time of the memory device can be reduced. Thus, an increased scale of integration with increased speed of memory cycling can be achieved at the same time.

The above-mentioned features and advantages of the present invention, together with other objects and advantages, which will become apparent, will be more fully described hereinafter.

BRIEF DESCRIPTION OF THE DRAWINGS

FIG. 1 is a block diagram of a time delay circuit.

FIG. 2A is a circuit diagram of a CR type delay circuit. FIGS. 2B-2C are timing diagrams for explaining the delay function of the CR type delay circuit.

FIGS. 3A-3C are timing diagrams for explaining malfunction of the CR type delay circuit.

FIGS. 10A-10F are timing diagrams for explaining the influence of noise signal.

DESCRIPTION OF THE PREFERRED EMBODIMENTS

Figure 4:
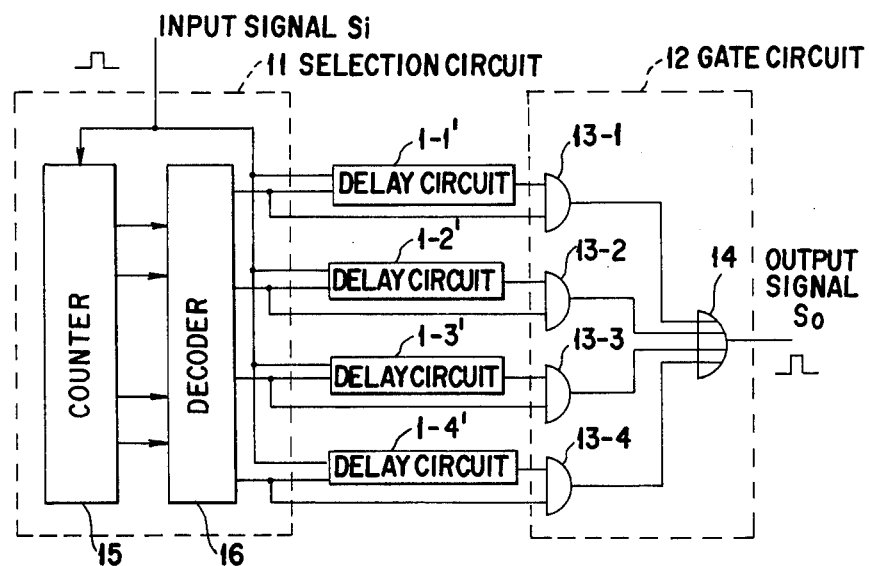
FIG. 4 is a block diagram of an embodiment of the present invention.
Figure 5:
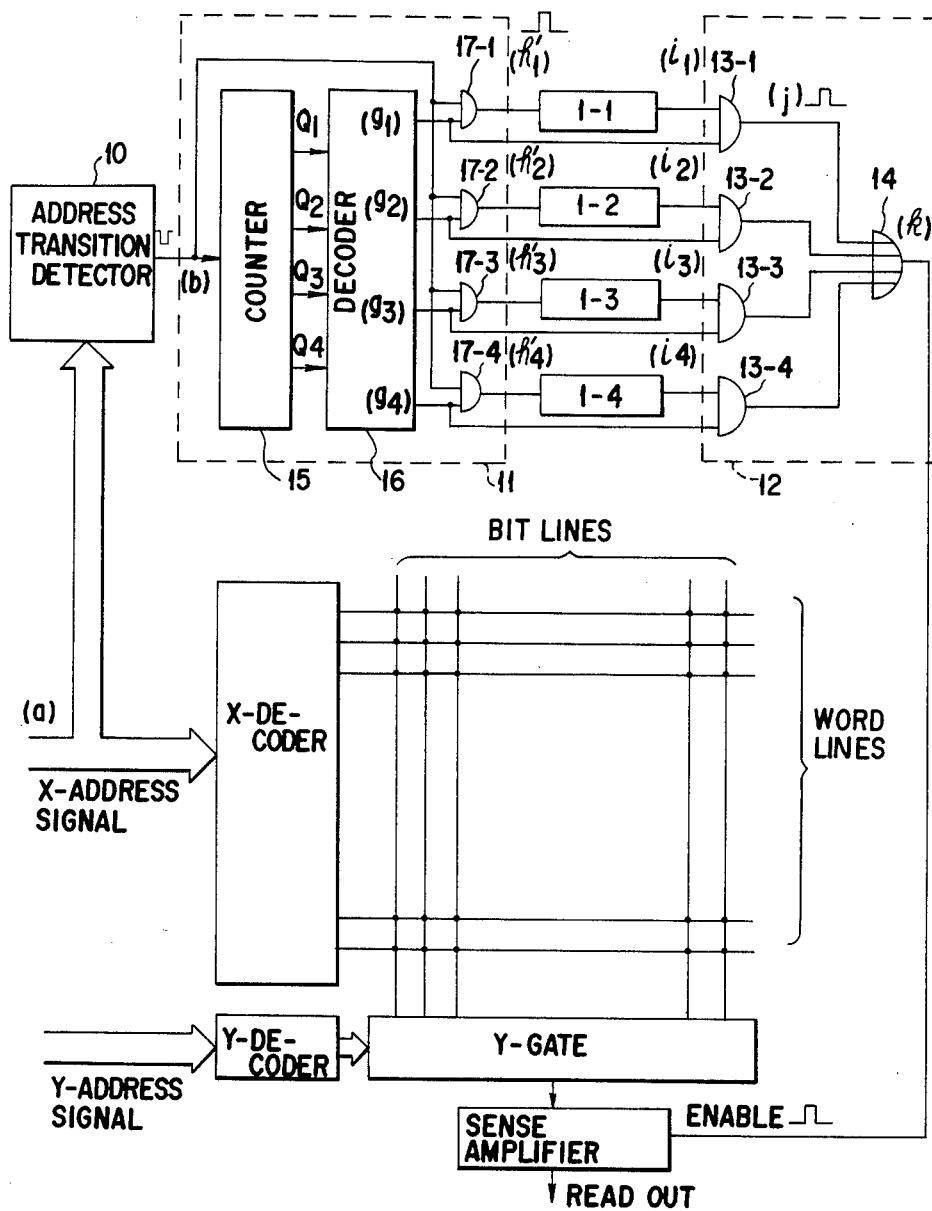
FIG. 5 is a block diagram of a semiconductor memory device having a time delay circuit of the present invention.
Figure 6:
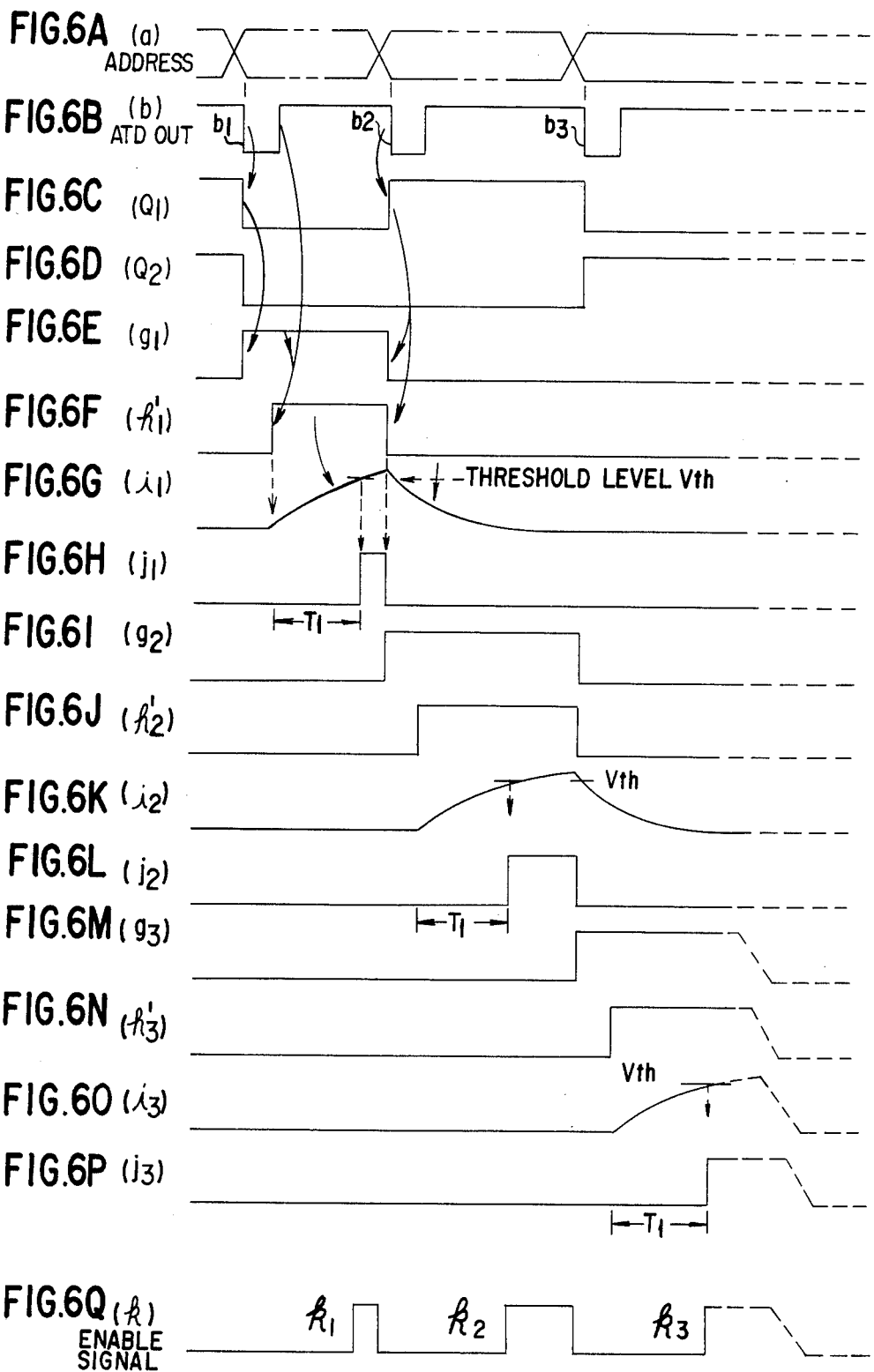
FIGS. 6A-6Q are timing diagrams for explaining the operation of the semiconductor memory device shown in FIG. 5.

The preferred embodiment of the present invention referring to FIG. 4 and an application to a semiconductor memory device in FIG. 5 shall be described hereinafter in detail. FIG. 4 is shown using a positive input signal pulse, but FIG. 5 is shown using negative input signal pulses. The timing diagrams for FIG. 5 are shown in FIGS. 6A-6Q. In these embodiments, four delay circuits 1-1 through 1-4 are provided. Each of delay circuits 1-1' through 1-4' of FIG. 4 includes each of the delay circuits 1-1 through 1-4 of FIG. 5 and each of AND gates 17-1 through 17-4 respectively at each input terminal of the delay lines 1-1 through 1-4. Therefore, the description shall be made for the circuit of FIG. 5, which can explain the operation of the circuit in FIG. 4. Each time an input signal $S_i$ as well as a noise signal is input to the selection circuit 11, one of the outputs of a decoder 16 therein is selectively activated. Each output of the decoder 16 is operatively connected to one of the delay circuits 1-1–1-4. Thus, one of the delay circuits 1-1∼1-4, for example the delay circuit 1-1, is selectively activated by the decoder 16. At this time, an AND gate 13-1, in a gate circuit 12, connected to the output terminal of the selected delay circuit 1-1 is enabled by the activated decoder's output $g_1$. When a delayed signal $i_1$ is output from the delay circuit 1-1, the AND gate 13-1 outputs the signal $j_1$ to an OR gate 14 in the gate circuit 12, which outputs a delayed signal $S_o$. In this state, a next input signal $b_2$ comes in to the selection circuit 11 as shown in FIG. 6B. Then, the selection circuit 11 selectively activates the second delay circuit 1-2 as well as discontinues to drive the previous delay circuit 1-1 by lowering the driving voltage of the output $g_1$ down to L. The output circuit of the selection circuit 11 is made up to be able to sink a current from its load, as a widely used common technique, so the charge in the delay circuit 1-1 begins to be discharged through the output circuit of the selection circuit 11 when this delay circuit is switched to "not-driven". At the same time, the AND gate 13-1 connected to the output terminal of previous delay circuit 1-1 is disabled, so that the previously used delay circuit 1-1 does not disturb output signals $i_2$ etc. from other delay circuits 1-2 etc. The selectively driven delay circuit 1-2 operates in the same way as the first delay circuit 1-1. The third and fourth input signals are respectively processed in the same way as above-described first and second inputs. However, the fifth input signal (not shown in the figure) is led to drive the first delay circuit 1-1 again, which is already discharged completely. This is because, in these embodiments where four delay circuits are provided, the counter 15 is chosen to be a divide-by-four counter to select four different outputs, so after counting a value four, the count returns back to value one. Thus, one of four outputs $g_1$–$g_4$ of the decoder 16, each output terminal of which is connected to each of the delay circuits 1 and each AND gate 13, is selected in circulating sequence, each time a signal or a noise is input to the counter 15. Description of the timing chart FIGS. 6A–6Q shall be made later in detail.

Figure 7:
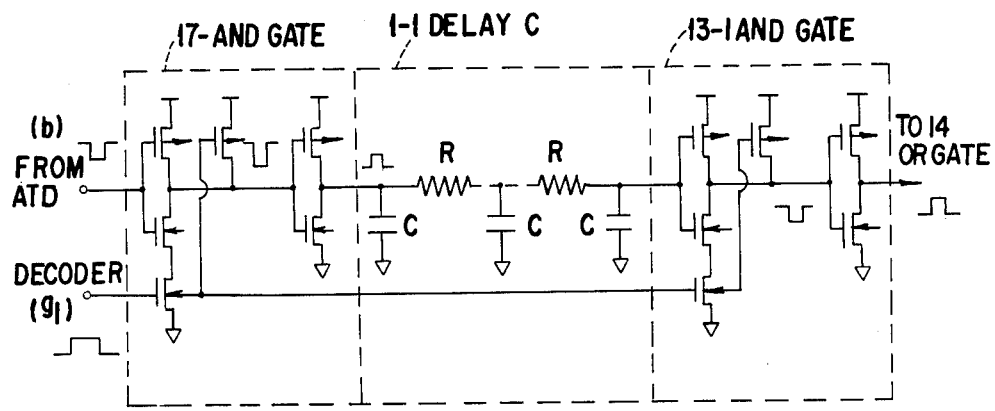
FIG. 7 is a circuit diagram of AND gates associated with a dummy word line shown in FIG. 5.
Figure 8:
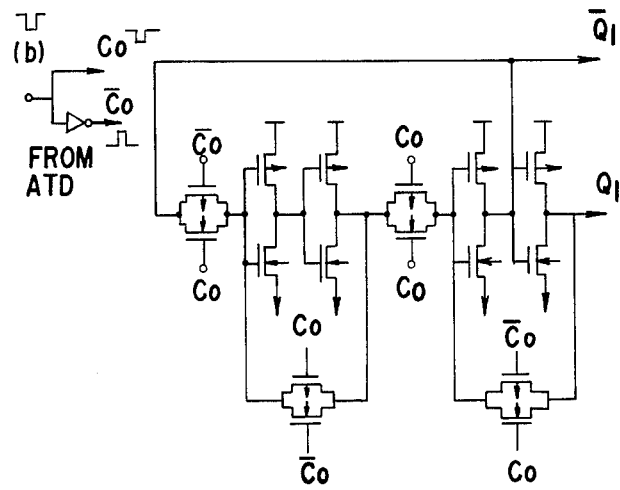
FIG. 8 is a circuit diagram of a counter in a selector circuit.
Figure 9:
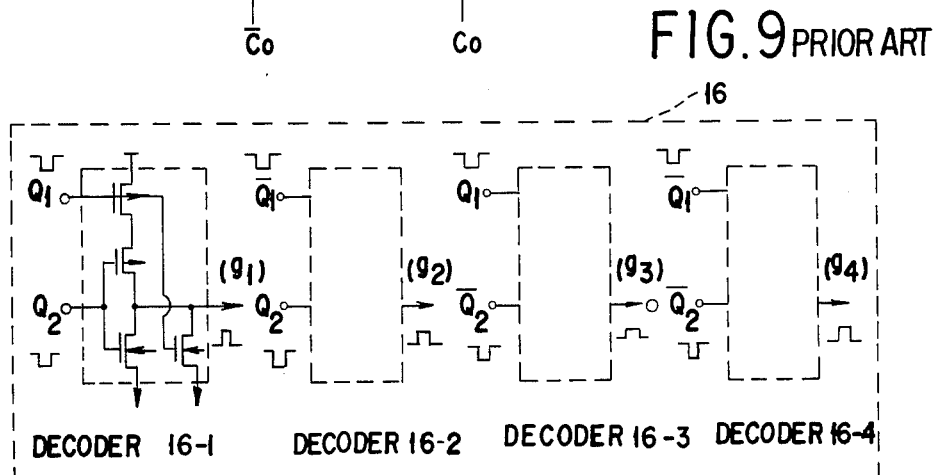
FIG. 9 is a circuit diagram of the decoder circuit shown in FIG. 5.

Further in more detail, main practical circuits of the embodiment of the delay circuit 1-1, the selection circuit 11 and the gate circuit 12 are described and referred to in FIGS. 8 and 9, though the circuit techniques employed are all well known. The circuit figures are all described with MOS (Metal Oxide Semiconductor) and CMOS (Complementary MOS) transistors. Description of details of each MOS and CMOS transistor is omitted because they all are well known. R and C in FIG. 7 denote respectively a resistance and a capacitance per unit length of the dummy word line, composing a distributed CR delay line.

A basic binary counter used in the counter circuit 15 is shown in FIG. 8. Firstly, the negative signal pulse b from the ATD is converted to $C_0$ and its complement $\overline{C_0}$, which are applied to the terminals denoted by $C_0$ and $\overline{C_0}$ respectively. Each time the negative input signal pulse b is applied twice, the output $Q_1$ and its complement $\overline{Q_1}$ are output. Therefore, a same basic binary counter, additionally connected in cascade to the first one, receiving $Q_1$ and $\overline{Q_1}$ as its inputs, can produce output signals $Q_2$ and its complement $\overline{Q_2}$, each time the input signal pulse b is input four times to the first basic binary counter. The decoder circuit 16 is composed of four decoder units 16-1∼16-4 shown by the boxes in FIG. 9. For example, the decoder unit 16-1 in FIG. 9 is a NOR gate, whose inputs are $Q_1$ and $Q_2$ and the output terminal $g_1$ is connected to an input terminal of an AND gate 17-1 connected to the delay circuit 1-1. When both of $Q_1$ and $Q_2$ are L (low level), the output $g_1$ becomes H (high level), thus selects the delay circuit 1-1. The blank units of 16-2 to 16-4 contain the same circuit as in the box of 16-1, but the inputs to each unit are of different combination of two L level signals out of the four output signals, $Q_1$ through $\overline{Q_2}$, of the counter so that each unit activates different delay circuit respectively. Thus, the decoder 16 selectively drives one of the delay circuits 1-1∼1-4 in sequence depending on the counted value of the counter 15. In FIG. 7 are shown practical circuits of AND gates 17-1, optionally included in the selection circuit 11. Inputs to the AND gate 17-1 are the input signal b and the output from the decoder 16-1. The output of the AND gate 17-1 is connected to the input terminal of the delay circuit 1-1 as described above. The AND gate 17-1 is composed of a NAND gate and an inverter, and is provided for initiating input signal to the delay circuit 1-1 by a rising edge of the negative input signal $b_1$. The driver stage of the AND gate 17-1 is composed of a single-ended push-pull configuration, therefore, the output terminal can sink the charge in the delay line when the output level is L. The AND gates 13-2∼13-4 and the NOR gate 14 in the gate circuit 12 are also composed similarly in a very general way.

An application of the present invention to an asynchronous semiconductor memory device, is shown in FIG. 5, where the delay circuits 1-1 through 1-4 are made similarly to the word lines. The input signal b is output of an address transition detector 10 (referred to hereinafter as ATD). The ATD 10 outputs a pulse signal b each time it detects a transition of X-address signals. The output k of the gate circuit 12 is an enabling signal to enable a sense amplifier which reads out datum stored in the addressed word line via bit lines. The timing of enabling the sense amplifier is at the time just after one of the word lines is charged high enough to be readed out, because the delay circuit 1 has essentially similar delay time to that of the word line.

The names of the graphs in the diagram FIGS. 6A–6Q are corresponding to the names of signals in the figures. A negative pulse is used for the input signal $b_1$ as shown in FIG. 6B. When AND gates 17-1 and 13-1 are enabled by the output $g_1$ of the decoder 16, signal $i_1$ rises gradually after the application of the input signal $h_1$ as shown in FIGS. 6E, 6F and 6G, because this graph shows the case where the delay circuit is of CR type. And, when the signal $i_1$ reaches the threshold level $V_{th}$ of the AND gate 13-1, the AND gate 13-1 outputs the signal $j_1$. Operation of the circuits for the inputs coming later than the third input $b_4$ are not shown in FIGS. 6A–6Q, however, the fifth signal $b_5$ is processed in the same way as those of the first input signal $b_1$.

Figure 10A:
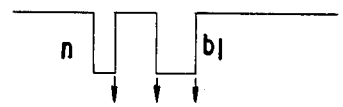

The ATD is likely to output a short noise pulse closely before a normal input signal, when the address signals change in some particular condition. However, according to the present invention, this noise does not affect operation of the delay circuit for the following normal signal, as is described below, referring to FIG. 10. When a noise pulse n, usually short and closely before a normal input signal $b_1$, is input to the selection circuit 11, the noise n is processed by the selection circuit 11 in the same way as that of a normal signal from the ATD. Thus the noise signal n is led to select and drive one of the delay circuits, for example 1-1, in the circulating sequence. However, this noise pulse n can not produce its output signal from the selected delay circuit 1-1, because the next input signal $b_1$ coming-in just after the noise pulse n is processed by the selection circuit to switch off the delay circuit 1-1 before the delayed output voltage $i_1$ of the delay circuit 1-1 reaches the threshold level $V_{th}$, and to selectively drive the next delay circuit 1-2. Thus the signal $b_1$ is correctly output from the gate circuit 12 without being disturbed by a remaining charge of the noise in the previously used delay circuit 1-1. In order to ensure to process the short noise, a wave-form shaping circuit, such as a one-shot multi-vibrator, (not shown in the figure) may be provided at the input of the selector circuit 11. Thus, a malfunction caused by noise is removed by the circuit configuration according to the present invention.

Another advantage of the present invention is speeding up the cycle time of memory access, as below-described. Even immediately after completing one cycle of delaying operation of an input signal $b_3$ for example, the circuits can be ready to accept the next incoming input signal $b_4$. It is because the next incoming signal $b_4$ is processed by the selection circuit 11 to drive the next delay circuit 1-4 without being disturbed by the remaining charge in the previously used delay circuit 1-3 whose output is already disabled by its AND gate 13-3. Thus, the memory cycling time can be reduced down to as short as the memory access time.

Although, four of the delay circuits are referred to in the above-described embodiments, other quantity, such as two, may be chosen as long as the circuit is properly designed so that the remaining charge in the delay circuit is substantially zero when the delay circuit is selected again by a new input signal.

The timing for initiating driving, i.e. charging, a selected delay circuit, and the threshold level $V_{th}$ of the gate circuit 12, i.e. the voltage level at which the enabling signal for the sense amplifier is to be output, are both in relation to the timing in the circuits associated with the word line and bit lines. Therefore, the method to obtain the timing described in the above-described embodiment is only an example, so other timing may be chosen depending on the used circuit. If the driving of the selected delay circuit is not initiated directly by the input signal pulse b, the AND gates 17 are not necessary.

Although in the above-described embodiment the delay circuit is made of distributed CR line similar to a word line, a digital delay circuit, such as a mono-stable multivibrator, or a series connection of inverters is also applicable to the delay circuit.

In the above-described embodiment of the asynchronous memory device, the input signal is an output from the ATD, however, if the memory device is of synchronous type, the input signal can be replaced by clock pulse.

Although the time delay circuit in the above-described embodiment is for obtaining a timing of charging word line, it is apparent that the time delay circuit according to the present invention can be employed for obtaining a timing of charging bit line, too, if needed.

Embodying the present invention, a 1M bit CMOS EPROM (Erasable Programmable Read Only Memory) having an access time 100 ns, and cycle time 100 ns is materialized. The percentage of area occupied by the added circuit according to the invention is order of 0.1%, which is quite negligible and requiring little cost increase.

The many features and advantages of the invention are apparent from the detailed specification and thus, it is intended by the dependent claims to cover such features and advantages of the system which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A semiconductor device comprising:
   a plurality of delay circuits delaying an input signal having a first level and a second level, said delay circuits having a predetermined delay time;
   a selection circuit connected to said delay circuits, said selection circuit selecting one of said delay circuits, in sequence, in response to a transition from the first level, which is an initial state, to the second level of the input signal and supplying said input signal of said second level to said selected one of said delay circuts, said selection circuit resetting unselected ones of said delay circuits to an initial state;
   a plurality of first gate circuits each of which having input terminals, a first input terminal being connected to an associated one of said delay circuits and a second input terminal being connected to said selection circuit's output terminal associated with said delay circuit, each of said first gate circuits outputting a delayed input signal only from said associated selected one of said delay circuits and inhibiting output from said each associated unselected one of said delay circuits by having a level of said second input terminal of said first gate circuit vary from said second level to said first level; and
   a second gate circuit, each input terminal of which being connected to an output terminal of each of said first gate circuits, wherein an output signal from any of said first gate circuits is output from said second gate, a noise pulse having said second level and ending within an interval prior to a a following signal pulse, said interval being essentially shorter than said delay time of said delay circuit, said noise pulse input into one of said delay circuits being inhibited from being output through said associated first gate circuit, and said following signal pulse, of said second level input into another one of delay circuits earlier than said interval which is prior to a next incoming signal pulse, being allowed to be output through said associated first and second gate circuits.

2. A semiconductor device according to claim 1, wherein said selection circuit includes:
   a counter for receiving said input signal;
   a decoder connected to said counter for decoding outputs from said counter; and a plurality of third gate circuits each of which having input terminals, a first input terminal receiving said input signal and a second input terminal being connected to an output terminal of said selection circuit, wherein a transition of level of said first or second input terminal from said second level to said first level initiates said selecting of said one of delay lines.

3. A semiconductor device according to claim 2, wherein said third gate circuit is an AND gate.

4. A semiconductor device according to claim 1, wherein:
said semiconductor device further includes memory circuit having an address transition circuit for detecting a transition of address signals, said address transition circuit outputting said input signal upon detecting said transition of address signals; and
said second gate circuit, operatively connected to said memory circut, supplies said delayed input signal as a control signal to said memory circuit.

5. A semiconductor device according to claim 4, wherein said memory circuit further comprising:
word lines; and
a plurality of dummy word lines, as said delay circuits, having similar delay characteristics to said word lines, said dummy word lines being fabricated simultaneously with said word lines.

6. A semiconductor device according to claim 4, wherein said memory circuit further comprising:
bit lines; and
a plurality of dummy bit lines, as said delay circuits, having similar delay characteristics to said bit lines, said dummy bit lines being fabricated simultaneously with said bit lines.

* * * * *